United States Patent
Egan et al.

(10) Patent No.: US 7,515,951 B2
(45) Date of Patent: Apr. 7, 2009

(54) ASSEMBLY, SYSTEM, AND METHOD FOR OPTIMIZING IMAGE QUALITY

(75) Inventors: Patrick Kevin Egan, Rochester, MN (US); Don Alan Gilliland, Rochester, MN (US); Cary Michael Huettner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 11/165,383

(22) Filed: Jun. 23, 2005

(65) Prior Publication Data

US 2006/0293590 A1 Dec. 28, 2006

(51) Int. Cl.
*A61B 5/05* (2006.01)
(52) U.S. Cl. ............... 600/415; 600/421; 600/422; 128/845; 128/865; 5/655.3; 324/318
(58) Field of Classification Search ............... 600/415, 600/421, 422; 128/845, 865; 5/655.3; 324/318
See application file for complete search history.

(56) References Cited

U.S. PATENT DOCUMENTS

| 5,490,513 | A | * | 2/1996 | Damadian et al. | 600/415 |
| 5,924,987 | A | * | 7/1999 | Meaney et al. | 600/420 |
| 6,882,878 | B2 | * | 4/2005 | Schmit et al. | 600/415 |
| 7,379,769 | B2 | * | 5/2008 | Piron et al. | 600/415 |
| 2005/0080332 | A1 | * | 4/2005 | Shiu et al. | 600/411 |

* cited by examiner

*Primary Examiner*—Brian Casler
*Assistant Examiner*—Parikha S Mehta
(74) *Attorney, Agent, or Firm*—Matthew C. Zehrer

(57) ABSTRACT

An assembly, system, and method particularly adapted for a magnetic resonator apparatus in a magnetic resonance imaging (MRI) scanning system. Provided is a restraining assembly supportable by the supporting assembly and including at least a system that is selectively operable for positioning and restraining at least a portion of the body to be imaged, thereby optimizing image quality.

7 Claims, 4 Drawing Sheets

ASSEMBLY, SYSTEM, AND METHOD FOR OPTIMIZING IMAGE QUALITY

BACKGROUND OF THE INVENTION

The present invention relates generally to the field of medical imaging and, more particularly, to an assembly, system, and method particularly adapted for a magnetic resonator apparatus in a magnetic resonance imaging (MRI) scanning system.

MRI is a non-invasive procedure utilized to obtain images of anatomical features for diagnostic purposes. The images are formed when signals emitted by body tissue are analyzed and converted to medical images. MRI has necessitated the use of specifically designed system components, such as a portable birdcage imaging resonator, etc. Specifically, MRI depicts parameters associated with nuclear spins (typically hydrogen protons associated with water in tissue) that are considered of value in medical diagnostics in determining the state of health of tissue in a region examined. Successful MRI techniques have also been extended to in vivo spectroscopy of elements such as phosphorus and carbon, thereby providing researchers with tools to study chemical processes in a living organism. Obtaining proper nuclear spinning of body tissue of interest is critical for successful MRI. Accordingly, it is extremely important that when conducting it, the body tissue of interest be precisely and positively aligned. It is also important for the body portion being imaged be properly spaced relative to the apparatus in order to avoid generating interference with any resulting images.

To satisfy the foregoing concerns, present approaches require skilled technologists in labor-intensive procedures. Ordinarily, a patients body portion is in a prone position on a table within a scanning type magnetic resonance imaging device. Relatively recently, portable image resonating units have been used for purposes of exposing even smaller selected portions of a body, such as the arm or leg. These portable units have the advantage of localizing the application of the MRI procedure to selected regions of the body. However, technologists must still obtain and retain proper patient positioning. This is more problematic when using the portable units. Otherwise, inadvertent movement and/or contact with the portable unit might degrade image quality. Retention is typically accomplished by having technologists stuff particulate-filled bags between the body and the portable image resonating unit. It will be appreciated that known approaches are relatively time consuming and tedious. In addition, they may be highly uncomfortable for patients with injuries.

Hence, the prior art is absent, an assembly, system, and method that are particularly adapted for automatically positioning body portions within a magnetic resonance imaging unit, whereby precise imaging is enhanced in an expeditious, economical, and reliable manner that minimizes patient discomfort. Therefore, there is a need for an assembly, system, and method that are particularly adapted for automatically positioning body portions within a magnetic resonance imaging unit, whereby precise imaging is enhanced in an expeditious, economical, and reliable manner that minimizes patient discomfort. Without satisfying the above, the true potential of medical imaging will not be fully realized.

SUMMARY OF THE INVENTION

The present invention provides enhanced assembly, systems and methods for properly positioning and restraining a patient with respect to a magnetic resonance imaging unit without negative effect and that overcomes many of the disadvantages of the prior art.

A magnetic resonance imaging apparatus comprising: a housing assembly for at least partially encircling a body portion; and, an adjustable positioning and restraining system coupled to the housing assembly and operable for automatically positioning and restraining a patient's body portion in a predefined location with respect to a preferred location along a longitudinal axis of the housing assembly.

A portable assembly adapted for magnetic resonance imaging of a body portion, the assembly comprising: a magnetic resonance imaging apparatus comprising: a housing assembly for at least partially encircling a body portion; and, an adjustable positioning and restraining system coupled to the housing assembly that is selectively operable for positioning and restraining a patient's body portion in a predefined location in an X-Y plane with respect to a longitudinal axis of the housing assembly.

In a preferred illustrated embodiment, the assembly includes a targeting mechanism, which facilitates positioning the specific body portion of interest to be relative to the radiofrequency elements of the supporting assembly.

An aspect of the present invention is an assembly, system, and method that are particularly adapted for automatically positioning body portions within a magnetic resonance imaging unit, whereby image quality is enhanced.

Another aspect of the present invention is to achieve the foregoing in an expeditious, economical, and reliable manner.

Another aspect of this invention is to achieve the foregoing in a manner that minimizes patient discomfort.

These and other features and aspects of the present invention will be more fully understood from the following detailed description of the preferred embodiments, which should be read in light of the accompanying drawings. It should be understood that both the foregoing generalized description and the following detailed description are exemplary, and are not restrictive of the invention.

DETAILED DESCRIPTION

Figure 1:
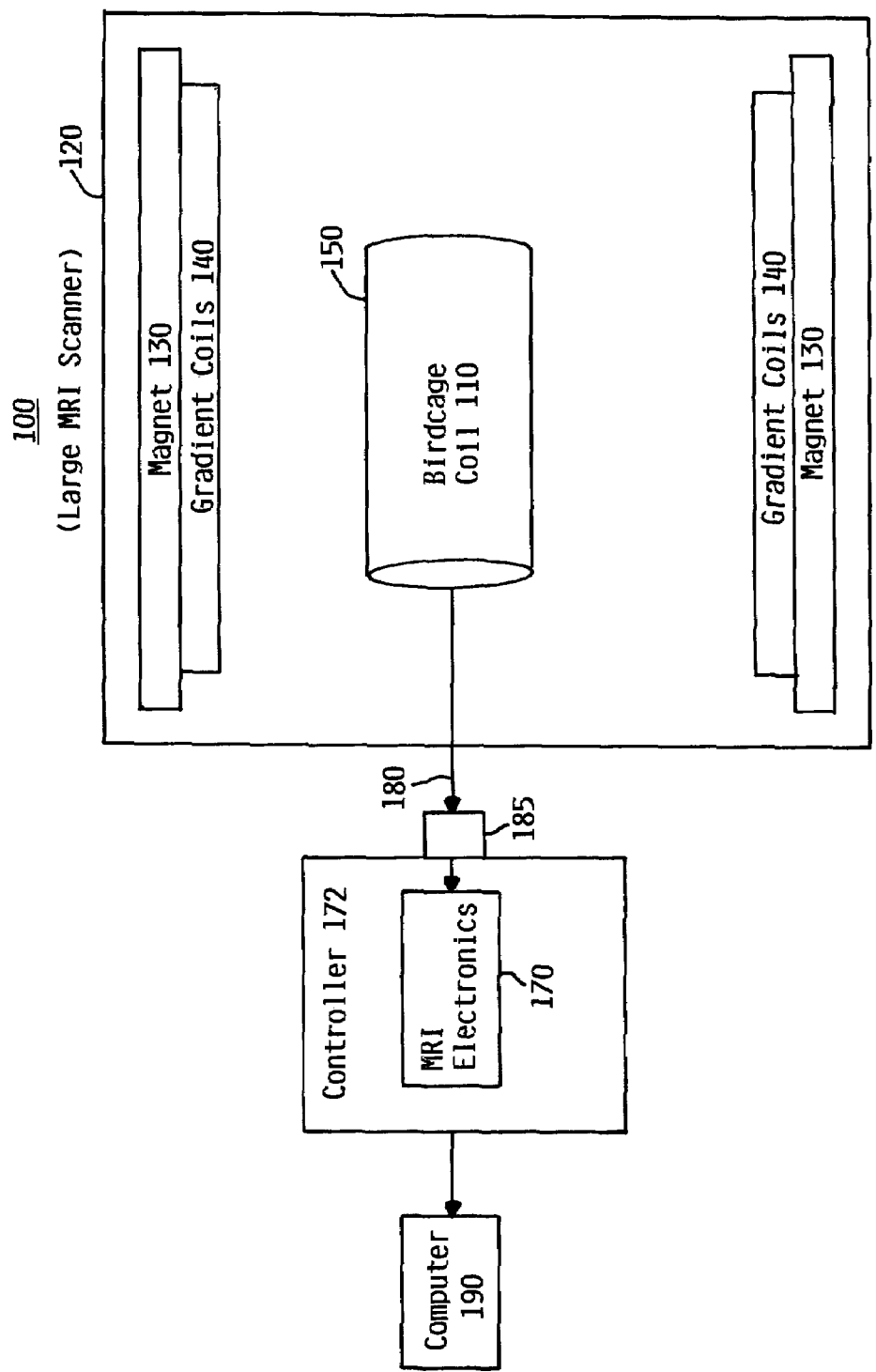
FIG. 1 is a block diagram of a magnetic resonance imaging (MRI) scanner system including an RF image resonator apparatus.

FIG. 1 illustrates one embodiment of a Magnetic Resonance Imaging (MRI) scanner system, generally denoted by reference numeral 100. The Magnetic Resonance Imaging (MRI) system 100 may be conventional type, such as is commercially available from General Electric. In the MRI system 100, use is made of a magnetic resonance imaging apparatus 110. In the present embodiment, the magnetic resonance imaging apparatus 110 may be a birdcage image resonator apparatus 110.

The MRI scanner system 100 may include a toroidal shaped coil area 120 that accommodates magnets 130 and gradient coils 140. The birdcage image resonator apparatus 110 may be a RF (Radio Frequency) type. The birdcage image resonator apparatus 110 may be of the kind that is commercially available from General Electric. Clearly, other kinds of MRI scanner systems are contemplated for use with the present invention. During the taking of MRI images, the birdcage image resonator apparatus 110 is placed within the toroidal shaped coil area 120. Although not shown an appendage of a patient is placed within the resonator apparatus 110. The construction and operation of the MRI scanner system 100 and the birdcage image resonator apparatus 110, per se, do not form aspects of the present invention. Consequently, only those aspects considered necessary for understanding the present invention will be set forth.

Figure 2:
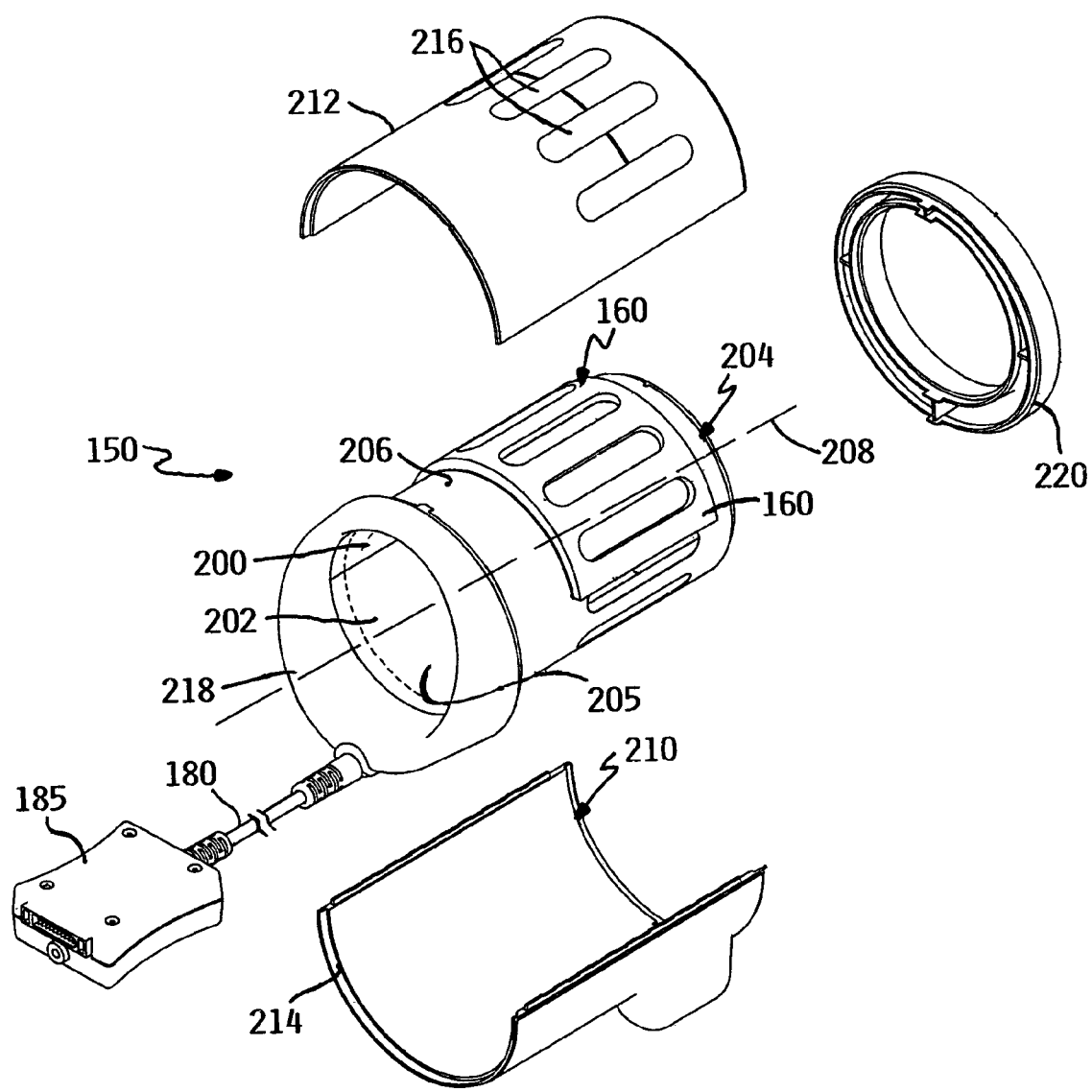
FIG. 2 is an exploded perspective view of one preferred embodiment of an RF image resonator for use with a positioning and restraining assembly of the present invention.

Reference is now made to FIG. 2 for illustrating the birdcage image resonator apparatus 110 that essentially includes a generally toroidal shaped housing assembly 150, and a cylindrical birdcage RF coil assembly 160 that is supported in the housing assembly. The RF coil assembly 160 is coupled to MRI electronics 170 by a cable 180 and connector 185. The MRI electronics 170 is further coupled to a computer system 190, which analyzes the data for a particular MRI image and stores and/or presents it to medical personnel for interpretation.

FIG. 2 illustrates one preferred embodiment of the birdcage image resonator apparatus 110. The birdcage image resonator apparatus 110 is particularly adapted for use in combination with the MRI system and an adjustable physical positioning and restraining system to be described hereinafter. The toroidal housing assembly 150 includes, preferably, upper and lower generally semi-circular, in cross-section, shell members 200, 202; respectively. The shell members 200, 202 are suitably joined to each other to form an inner housing core assembly 204 that defines an axially extending cavity 205. The shell members 200, 202 are, preferably, made of a plastic material, such as polycarbonate or the like that serves as a dielectric material, whereby the propagation of RF signals that are generated by the RF coil assembly 160 are not diminished. The inner housing core assembly 204 may be translucent and/or transparent. This facilitates placement thereof over or relative to a patient. The inner housing core assembly 204 is sized and configured to encompass a portion, such as an arm, leg, etc. of a patient (not shown) to be imaged. The present invention is not limited to any size and/or configuration of the inner housing core assembly 204 or for that matter the remainder of the birdcage resonator.

The RF coil assembly 160 is mounted on the inner housing core assembly 204. The RF coil assembly 160 may include a series of inductors and capacitors (not shown) that are generally longitudinally extending and circumferentially spaced with respect to each other along a toroidal flex sleeve 206 to define radiofrequency elements. The toroidal sleeve 206 is mounted on the inner core assembly 204 and extends along a longitudinal axis 208 of the latter. The series of inductors and capacitors (not shown) of the toroidal flex sleeve 206 are operable for generating a uniform field for use in the diagnostic imaging to be performed by the birdcage image resonator apparatus 110.

The toroidal housing assembly 150 includes an outer housing core assembly 210 that surrounds the RF coil assembly 160. The outer housing core assembly 210 includes, preferably, upper and lower generally semicircular shell members 212, 214 that are joined to each other. The outer housing core assembly 210 includes a plurality of circumferentially spaced transparent windows 216 that allow a technologist to visually locate the patient's body portion of concern relative to the toroidal housing assembly, whereby the body portion of concern may be properly located for imaging in a manner to be described. The windows 216 may be an integral part of the outer housing core assembly 210. A pair of plastic end caps 218, 220 serves to hold housing assembly together in a known manner. The cable 180 extends thru one of the end caps 218 and is suitably coupled to the RF coil assembly 160 at one end and the connector 185 at the other end. The connector 185 is coupled to the MRI electronics 170 in a controller 172. The controller is coupled to one or more computers in a computer system 190.

Figure 4:
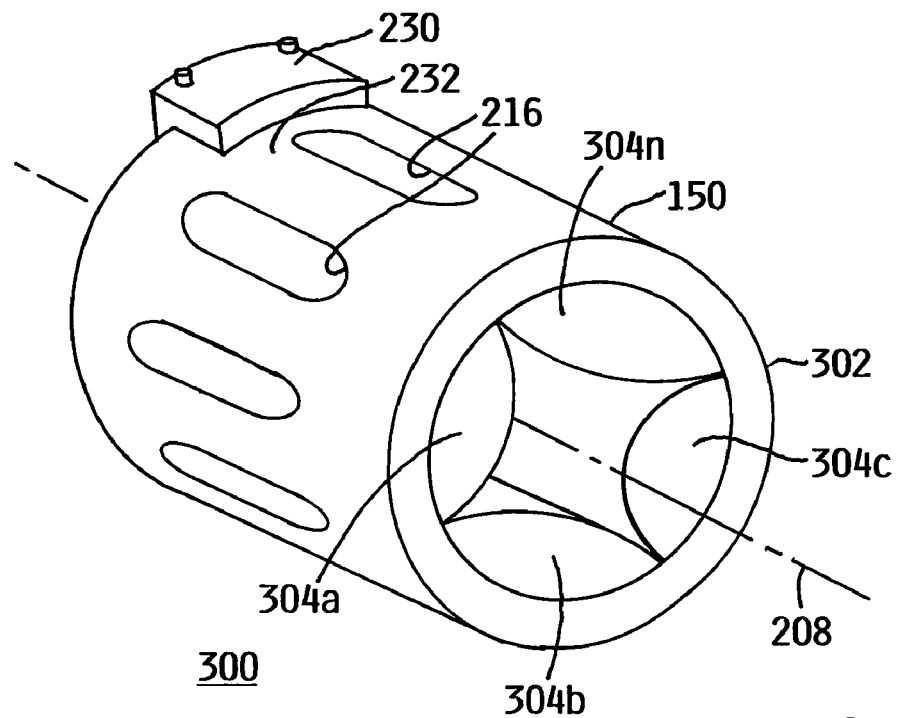
FIG. 4 is a schematic perspective view of an RF image resonator apparatus with a positioning and restraining assembly and a patient targeting apparatus.
Figure 5:
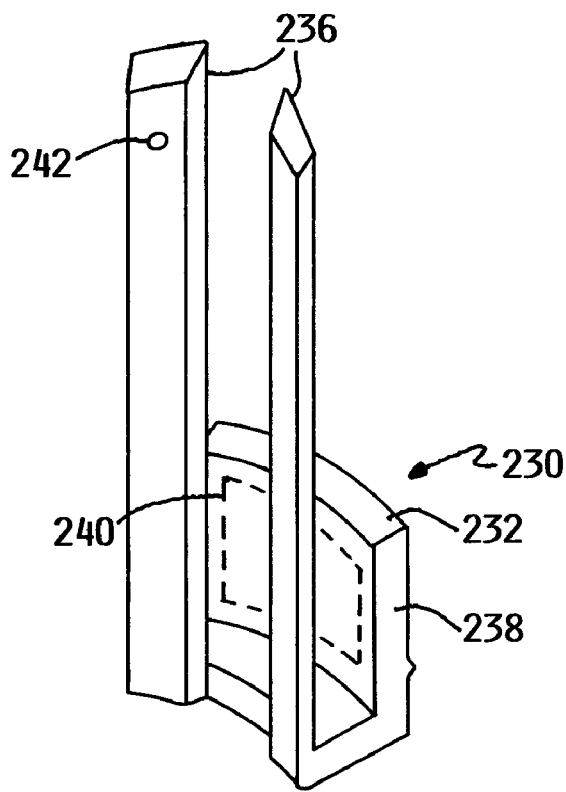
FIG. 5 is a schematic perspective view of the targeting apparatus adapted to be part of the positioning and restraining assembly of the present invention.

Reference is now made to FIGS. 4 & 5 for illustrating a patient targeting apparatus 230 that is, preferably, releasably coupled to the housing assembly 150. The targeting system 230 is operable for generating targeting beams that are directed at the axis 208 of the RF coil assembly 160. A housing assembly 232 is, preferably, made of a material that does not affect any of the RF frequencies used by the RF coil assembly 160. Such material may be plastic, such as polycarbonate or the like. Other suitable materials may be utilized. The patient targeting apparatus 230 has, preferably, its housing assembly 232 constructed to be releasably clipped to one end of the housing assembly 150. A fixed connection is also contemplated. The housing assembly 232 may include a pair of generally parallel leg portions 236 extend inwardly into the cavity from a body portion 238. The body portion 238 may include a power source 240, such as a battery. The power source 240 is connected to a pair of light-emitting diodes (not shown) within the body portion 234. Each of the leg portions 236 may include plastic lightpipes (not shown) that axially extend therewithin. Each of the lightpipes may terminate at an aperture 242 formed in the leg portions 236. The leg portions 236 are dimensioned so that the apertures 238 are located over that area of the patient that the magnetic imaging beam generated by the MRI system 100 is directed. As a result, the beams of targeting lights facilitate properly locating the patient's body portion concern. A switch (not shown) can be provided to control illumination.

Figure 3:
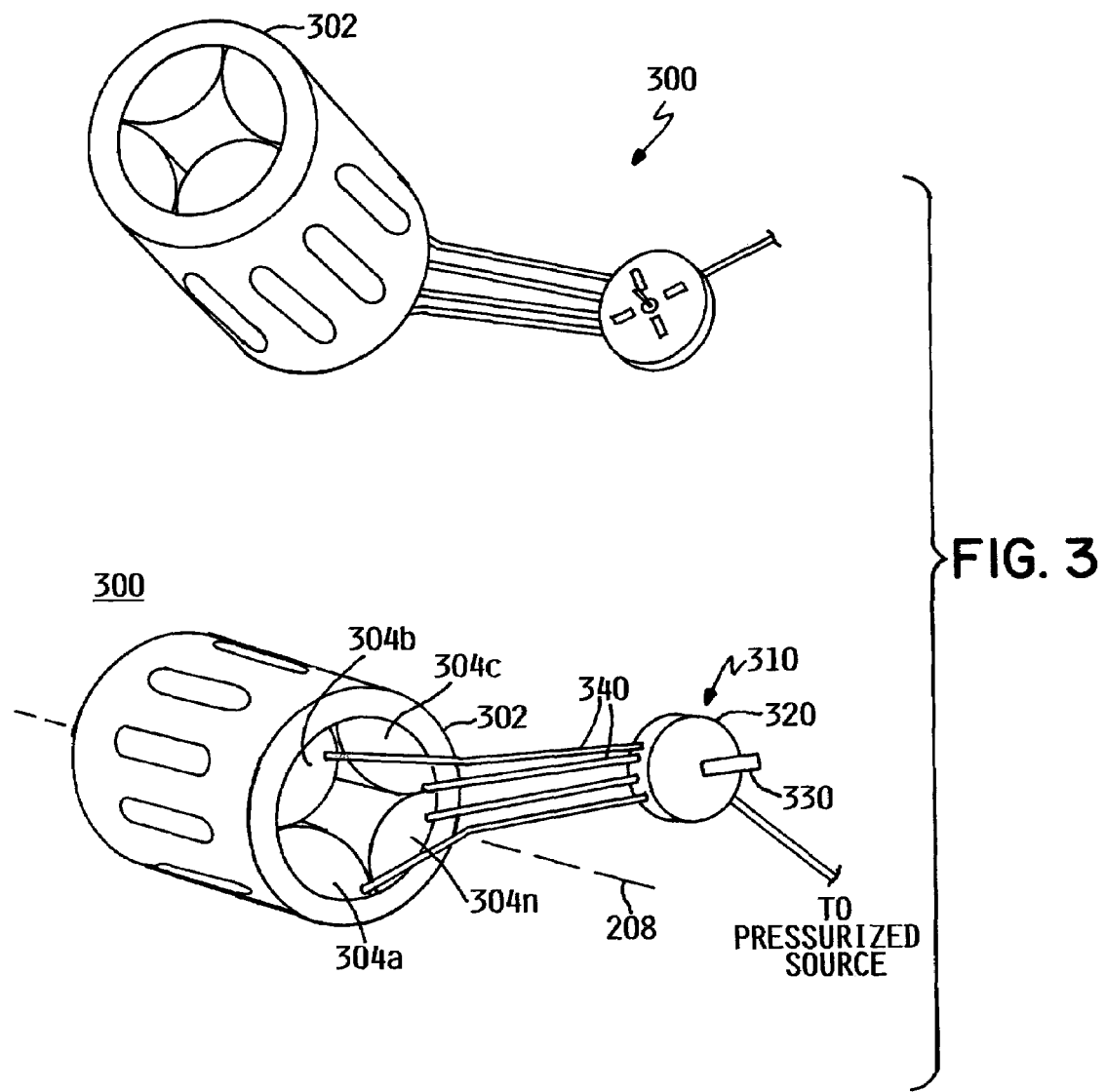
FIG. 3 is a schematic perspective view of an RF image resonator apparatus with a positioning and restraining assembly of the present invention in an expanded condition.

FIGS. 3 and 4 illustrate one preferred embodiment of an adjustable physical positioning and restraining system 300 made consistent with the teachings of the present invention. Essentially, the system 300 includes an expansible sleeve assembly 302 and a bladder system including, preferably, a plurality of fluidically expandable bladder units 304 a-n (collectively 304) that are intended to engage and restrain a body portion within the cavity. Each of the bladder units 304 is a generally longitudinally extending and circumferentially spaced with respect to each other. To avoid or minimize interference with operation of the birdcage image resonator, the material of the bladder units 304 is selected to avoid interference with the RF and the visual sighting of a targeting system to be described. In this regard, the material of the bladder units 304 may, preferably, be of a suitable transparent and/or translucent polypropylene material for example. Other suitable materials exhibiting such properties may be utilized.

Preferably, each of the bladder units 304 is comprised of a generally flexible material for receiving pressurized fluid. In response, the bladder unit 304 expands in a generally radial direction inwardly toward the axis 208 along the longitudinal extent of the bladder. As a result, the body portion received within the cavity size of the opening may be snuggly restrained. The bladder units 304 may be also be releasably coupled to the housing assembly 150. It will be noted that the legs 236 of the targeting system are, preferably, disposed in such a manner as to not obstruct the operation of the bladders 304.

The control system 310 is adapted to be fluidically connected with a source of pressurized air (not shown). Each one of the bladder units 304 is preferably adapted to be individually under the control of the control system 310. The control system 310 may include a user activated fluid switch mechanism 320. The fluid switch mechanism 320 may be a pneumatic type whereby a handle 330 is manipulated to control pressurizing and venting depending on the position of the handle. Other similar kinds of switches may be utilized. The control system 310 regulates the admission and venting of air from each bladder unit 304 in a controlled manner through flexible tubes 340. A supply of pressurized fluid (not shown) is provided to supply the pressurized air. By being independently actuated, the bladder units 304 facilitate precise positioning and restraint of a patient within an X-Y plane defined within the cavity relative to the longitudinal axis 208. It will be appreciated that after a patient's limb is placed in the housing assembly it may be positioned thru selective regulation of the expandable bladder units 304. Not only will the bladder units 304 be utilized for achieving the correct positioning, but also will serve to retain the patient's limb in the desired position. Because of the compressible nature of the expandable bladder units 304, the patient need not experience much if any inconvenience or discomfort. It will be appreciated that the invention is not limited to particular types of birdcage image resonators or MRI systems, since its principles embrace other similar imaging systems. The present invention can be used in a variety of other imaging apparatus for effecting patient positioning and restraint while doing it in a manner that facilitates patient comfort.

Operation of the foregoing construction is self-evident. However, to supplement such description the following brief description is provided. A technologist will place the body portion of concern in the cavity in juxtaposed relationship with respect to the supporting assembly. The targeting mechanism is operated for accurately positioning the body portion of concern along the axis. The pneumatic control is operated to expand the bladder units in the X-Y plane after the body portion of concern has been precisely positioned. Thereafter, the radiofrequency elements are operated to effect an imaging in the usual manner associated with the art.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. An assembly for imaging a body portion, comprising:
    a portable supporting assembly adapted to be positioned in relation to at least a portion of a body to be imaged;
    a coil assembly supported by the supporting assembly for generating a field;
    a restraining assembly comprising a plurality of selectively expandable bladder chambers for positioning and restraining the portion of the body to be imaged in a preferred position, and a fluid control system for selectively controlling the addition or removal of fluid into or from each expandable bladder chamber, and;
    a targeting assembly supported by the supporting assembly comprising a light source, a light emitting aperture, and at least one appendage extending through the supporting assembly, wherein the appendage supports the transfer of light from the light source to the light emitting aperture, and wherein the appendage is arranged within the supporting assembly such that the emitted source of light targets the preferred position.

2. A magnetic resonance imaging apparatus for use in a magnetic resonance scanning system comprising:
    a portable housing assembly for at least partially encircling a body portion;
    a coil assembly supported by the housing assembly for generating a field;
    an adjustable positioning and restraining system coupled to the housing assembly comprising a plurality of selectively expandable bladder chambers for positioning and restraining the body portion in a predefined location in an X-Y plane with respect to a longitudinal axis of the housing assembly; a fluid control system for selectively controlling the addition or removal of fluid into or from each expandable bladder chamber, and;
    a targeting assembly supported by the housing assembly comprising a light source, a light emitting aperture, and at least one appendage extending through the housing assembly, wherein the appendage supports the transfer of light from the light source to the light emitting aperture, and wherein the appendage is arranged within the housing assembly such that the emitted source of light targets the preferred position.

3. The apparatus of claim 2 wherein the coil assembly further comprises one or more radiofrequency (RF) elements.

4. The apparatus of claim 3 wherein the the plurality of expandable bladder chambers are made of material having properties to avoid interference with radiofrequencies of the coil assembly, and allow for visual sighting of the light provided by the targeting system.

5. The apparatus of claim 4 wherein the plurality of expandable bladder chambers comprise generally transparent or translucent materials.

6. The apparatus of claim 4 wherein the targeting system is releasably coupled to the supporting assembly and a power source thereof is located outside the coil assembly.

7. A method of optimizing image quality in a magnetic resonance imaging apparatus, comprising:
    providing a portable supporting assembly adapted to be positioned in relation to at least a body portion wherein the supporting assembly includes one or more radiofrequency elements;
    providing a restraining assembly comprising a plurality of selectively expandable bladder chambers, and a fluid control system for selectively controlling the addition or removal of fluid into or from each expandable bladder chamber, wherein the restraining assembly is supported by the supporting assembly and is selectively operable for positioning and restraining the body portion in a preferred position;
    providing a targeting system supported by the supporting assembly comprising a light source, a light emitting aperture, and at least one appendage extending through the supporting assembly, wherein the appendage supports the transfer of light from the light source to the light emitting aperture, and wherein the appendage is arranged within the supporting assembly such that the emitted source of light targets the preferred position;

placing the body portion in relation to the supporting assembly, whereby the targeting system is used for accurately positioning the body portion;

operating the restraining assembly to retain the body portion in the preferred position; and, imaging the body portion after activating the radiofrequency elements.

* * * * *